(12) United States Patent  
Ikeda (10) Patent No.: US 9,165,892 B2  
(45) Date of Patent: Oct. 20, 2015

(54) ELECTRONIC COMPONENT

(71) Applicant: Kabushiki Kaisha Toshiba, Minato-ku (JP)

(72) Inventor: Kentaro Ikeda, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 42 days.

(21) Appl. No.: 14/077,843

(22) Filed: Nov. 12, 2013

(65) Prior Publication Data

US 2014/0183555 A1 Jul. 3, 2014

(30) Foreign Application Priority Data

Dec. 27, 2012 (JP) ................................. 2012-286118

(51) Int. Cl.
*H01L 23/60* (2006.01)
*H01L 23/31* (2006.01)
*H01L 23/495* (2006.01)
*H01L 29/16* (2006.01)
*H01L 29/20* (2006.01)

(52) U.S. Cl.
CPC ............ *H01L 23/60* (2013.01); *H01L 23/3107* (2013.01); *H01L 23/49562* (2013.01); *H01L 29/1608* (2013.01); *H01L 29/2003* (2013.01); *H01L 2924/0002* (2013.01)

(58) Field of Classification Search
CPC ..................................................... H01L 23/60
USPC ......................................... 174/548; 361/818
See application file for complete search history.

(56) References Cited

U.S. PATENT DOCUMENTS

| 2005/0164482 | A1* | 7/2005 | Saxler ........................... 438/604 |
| 2011/0049685 | A1* | 3/2011 | Park et al. ..................... 257/660 |
| 2011/0049701 | A1* | 3/2011 | Miyagawa .................... 257/712 |
| 2013/0114235 | A1* | 5/2013 | Leal .............................. 361/818 |

FOREIGN PATENT DOCUMENTS

JP 5-206246 8/1993

* cited by examiner

*Primary Examiner* — Peniel M Gumedzoe
*Assistant Examiner* — Christopher Johnson
(74) *Attorney, Agent, or Firm* — Oblon, McClelland, Maier & Neustadt, L.L.P.

(57) ABSTRACT

According to one embodiment, an electronic component includes a device having a plurality of electrodes; a lead electrically connected to each of the plurality of electrodes; a first resin body sealing the device and a portion of the lead; and a first conductive body connected to the leads and contactable with a second conductive body.

18 Claims, 8 Drawing Sheets

ELECTRONIC COMPONENT

CROSS-REFERENCE TO RELATED APPLICATIONS

This application is based upon and claims the benefit of priority from Japanese Patent Application No. 2012-286118, filed on Dec. 27, 2012; the entire contents of which are incorporated herein by reference.

FIELD

Embodiments described herein relate generally to an electronic component.

BACKGROUND

Recently, technologies in which wide gap semiconductors such as Gallium Nitride (GaN) and silicon carbide (SiC) are used as substrates in power semiconductor devices have been the focus attention.

However, wide gap semiconductor devices generally have a lower resistance to static electricity than silicon semiconductor devices. This condition remains unchanged even when the wide gap semiconductor device is contained in a resin-sealed semiconductor package.

To improve the resistance of the semiconductor package to static electricity, a method exists whereby an external protective circuit is installed with the semiconductor package. However, such techniques require extra work and lead to an increase in cost.

DETAILED DESCRIPTION

In general, according to one embodiment, an electronic component includes a device having a plurality of electrodes; a lead electrically connected to each of the plurality of electrodes; a first resin body sealing the device and a portion of the lead; and a first conductive body connected to the leads and contactable with a second conductive body.

Hereinafter, embodiments will be described below with reference to the drawings. In the following description, the same reference numeral is applied to the same member, and for members that have been described once, the description is omitted as appropriate.

First Embodiment

Figure 1A:
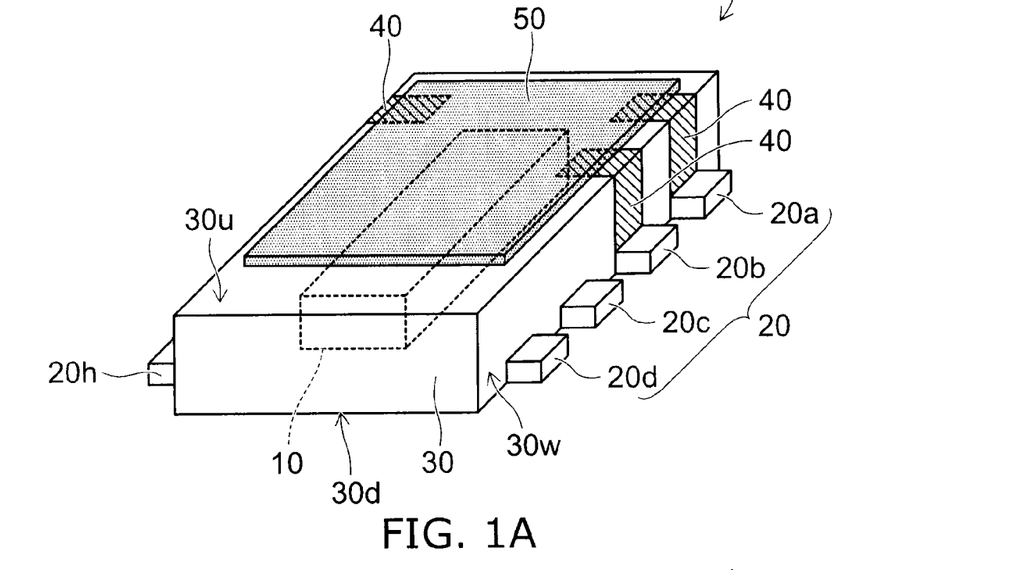
FIG. 1A is a schematic perspective view of an electronic component according to a first embodiment.
Figure 1B:
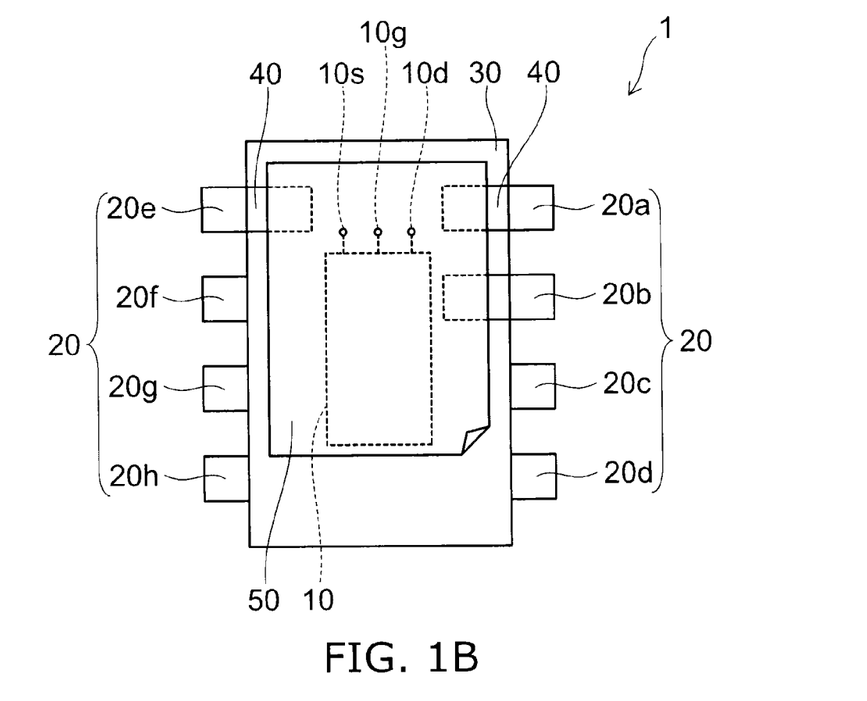
FIG. 1B is a schematic plan view of an electronic component according to the first embodiment.

FIG. 1A is a schematic perspective view of an electronic component according to a first embodiment. FIG. 1B is a schematic plan view of an electronic component according to the first embodiment.

An electronic component 1 illustrated in FIG. 1A and FIG. 1B is a so-called semiconductor package in which a semiconductor device such as a transistor or the like is sealed within a resin. The electronic component 1 is also called a surface-mounted package due to being mounted on a later-described circuit board. The semiconductor device includes a power semiconductor device.

The electronic component 1 includes a semiconductor device 10, a plurality of leads 20, a resin body 30 (first resin body), a plurality of conductive bodies 40 (first conductive body), and a conductive body 50 (second conductive body).

The semiconductor device 10 is, for example, a metal oxide semiconductor field effect transistor. The semiconductor device 10 has a plurality of electrodes. The plurality of electrodes is, for example, a gate electrode, a source electrode and a drain electrode of a field effect transistor. A semiconductor substrate of the semiconductor device 10 includes one of a gallium nitride (GaN) layer and silicon carbide (SiC) layer. Alternatively, the semiconductor substrate of the semiconductor device 10 may be a silicon (Si) layer.

When the semiconductor substrate of the semiconductor device 10 includes a gallium nitride layer or a silicon carbide layer, the semiconductor device 10 is a wide gap semiconductor device that excels at high-speed switching with reduced power loss. Note that the semiconductor device 10 is not limited to being a field effect transistor and may be a diode. When the semiconductor device 10 is a diode, the plurality of electrodes includes an anode electrode and a cathode electrode, or the like.

The plurality of leads 20 include leads 20a, 20b and 20e, which are electrically connected to a corresponding plurality of electrodes of the semiconductor device 10. For example, of the plurality of leads 20, a lead 20a is connected to a gate electrode 10g of the semiconductor device 10, a lead 20b is connected to a source electrode 10s of the semiconductor device 10, and a lead 20e is connected to a drain electrode 10d of the semiconductor device 10.

Note that the leads 20c and 20d are connected in parallel to the source electrode 10s of the semiconductor device 10 with the lead 20b, and the leads 20d to 20h are connected in parallel to the drain electrode 10d of the semiconductor device 10 with the lead 20e.

The semiconductor device 10 and the respective portions of the plurality of leads 20 are sealed within the resin body 30. Each of the leads 20 includes inner leads, which are portions sealed by the resin body 30, and outer leads protruding from the surface of the resin body 30. The resin body 30 has insulating properties. The plurality of conductive bodies 40 are provided on the resin body 30, respectively. The plurality of conductive bodies 40 is connected to the plurality of leads 20a, 20b and 20e, respectively. For example, the plurality of conductive bodies 40 may be contactable to outer leads of the plurality of leads 20a, 20b and 20e, respectively. The plurality of conductive bodies 40 can each contact a conductive body 50. The conductive body 50 can be mounted on the surface of the resin body 30, and can be removed from that surface. After being mounted, the conductive body 50 is provided on the resin body 30, and contacts all of the plurality of conductive bodies 40.

The resin body 30 includes an upper surface 30u, a lower surface 30d and side surfaces 30w. The external form of the resin body 30 may, for example, be a cuboid. Each of the plurality of leads 20 has a portion sealed by the resin body 30. A part of each of the plurality of leads 20 protrudes from one or other of the side surfaces 30w of the resin body 30. Conductive bodies 40 are connected to leads 20 at the protruding portions.

Each of the plurality of conductive bodies 40 extends from the corresponding one of the plurality of leads 20a, 20b and 20e to an upper surface 30u of the resin body 30 along the side surface 30w of the resin body 30. Each of the plurality of conductive bodies 40 is formed by a metal layer.

In the embodiment, "metal" refers to a material including at least one metal selected from among copper (Cu), aluminum (Al), platinum (Pt), iron (Fe), cobalt (Co), nickel (Ni), chromium (Cr), titanium (Ti) and the like. Also, "resin" refers to a resin including an epoxy resin.

The conductive body 50 is provided on the upper surface 30u of the resin body 30 and on the plurality of conductive bodies 40 that extend to the upper surface 30u of the resin body 30. A total of a resistance of the plurality of conductive bodies 40 and a contact resistance of the plurality of conductive bodies 40 and the conductive body 50 is 150Ω or less.

The conductive body 50 is, for example, a conductive seal. The conductive seal is, for example, a conductive film, a metal vapor deposition film or the like. The conductive seal is a seal having both conductive and adhesive properties, and can be easily peeled from the resin body 30.

In addition, a material may be chosen for the conductive seal, which exhibits an abrupt change in conductivity when heated to a predetermined temperature. For example, when electronic component 1 is mounted on a circuit board, solder is generally used as the joining material between the semiconductor component 1 and the circuit board. For the conductive seal, a material that exhibits an abrupt increase in resistance above the melting point of solder (at for instance, 150 to 300° C.) may be selected.

Note that the conductive body 50 is not limited to being a conductive seal and may be a body including both a conductive material and an adhesive material. For example, the conductive material may be, for instance, a metal, metal fine particles or the like, and the adhesive material may be, for instance, a polyester adhesive material, and adhesive acrylic material or the like. The conductive body 50 is a mixture of the conductive material and the adhesive material. Alternatively, the conductive body 50 may be a conductive gel.

For the adhesive material, a material that exhibits an abrupt drop in viscosity when heated to a predetermined temperature (such as the melting point of solder) may be selected.

Further, the conductive body 50 may be a metal thin film, a conductive vapor deposition film, or the like.

Figure 2A:
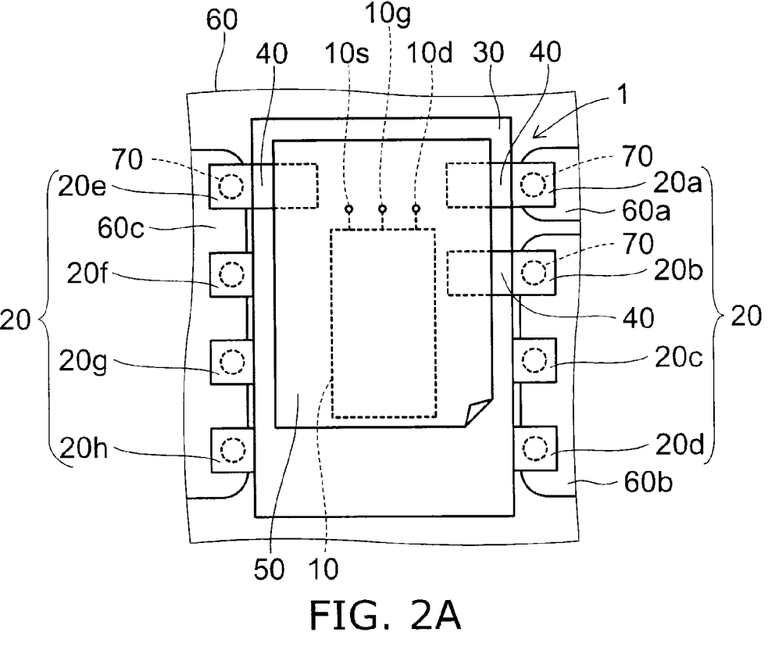
FIG. 2A is a schematic plan view of the electronic component prior to peeling of the conductive body.
Figure 2B:
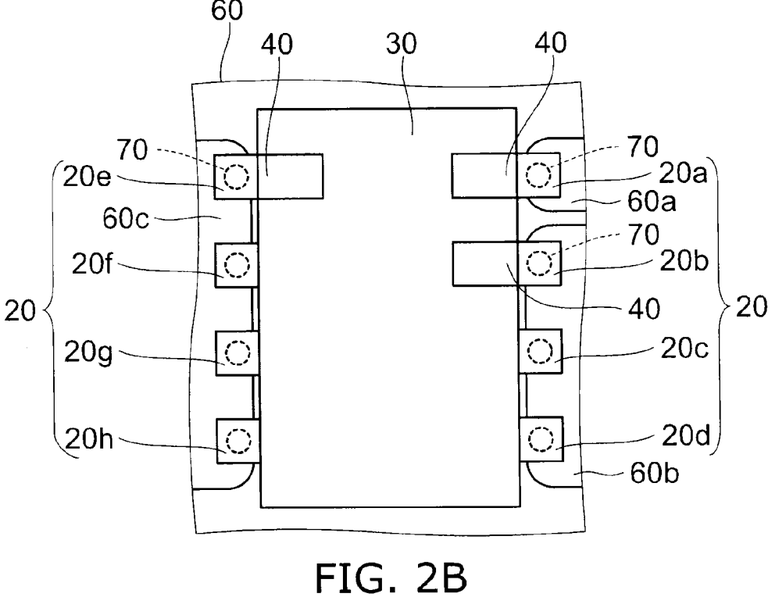
FIG. 2B is a schematic plan view of the electronic component after removal of the conductive body.

FIG. 2A is a schematic plan view of the electronic component prior to peeling of the conductive body, and FIG. 2B is a schematic plan view of the electronic component after removal of the conductive body.

In FIG. 2A, a state immediately following the mounting of the electronic component 1 on the circuit board 60 is illustrated. The mounting of the electronic component 1 on the circuit board 60 is performed using reflow processing. In the reflow processing, heat is applied to raise a temperature to the melting point of solder material 70 or higher, and the solder material 70 is then cooled so that the temperature of the solder material 70 falls below the melting point.

As a result, the lead 20a connected to the gate electrode 10g of the semiconductor device 10 is joined to a circuit pattern 60a on the circuit board 60 via the solder material 70. The lead 20b connected to the source electrode 10s of the semiconductor device 10 is joined to a circuit pattern 60b of the circuit board 60 via the solder material 70. The lead 20e connected to the drain electrode 10d of the semiconductor device 10 is joined to a circuit pattern 60c of the circuit board 60 via the solder material 70.

Next, the conductive body 50 is removed from the electronic component 1 as illustrated in FIG. 2B. For conductive body 50 illustrated in FIG. 2B, the above-described conductive seal may, for example, be used. For example, the conductive body 50 can be removed from the electronic component 1 by automatically or manually peeling off the conductive body 50. After the conductive body 50 has been removed from the electronic component 1, the gate electrode 10g, the source electrode 10s and the drain electrode 10d of the semiconductor device 10 are each in a state of not being electrically connected. Note that the form of the electronic component resulting from removal of the conductive body 50 from the electronic component 1 is also included in the first embodiment.

The conductive body 50 is provided on the surface of the resin body 30 until immediately after mounting, following the sealing the separated semiconductor device 10 in the resin body 30. Accordingly, in the period between the sealing of the semiconductor device 10 using the resin body 30 and immediately after the mounting (hereinafter referred to as "the period"), the gate electrode 10g, the source electrode 10s and the drain electrode 10d of the semiconductor device 10 are each electrically short-circuited.

The short circuiting is a result of the lead 20a electrically connected to the gate electrode 10g, the lead 20b electrically connected to the source electrode 10s and the lead 20e electrically connected to the drain electrode 10d each being connected to the conductive body 50 via the conductive bodies 40.

In the period, the electronic component 1 is reliably protected against static electricity. This protection is provided because the gate electrode 10g, the source electrode 10s and the drain electrode 10d are each at the same potential due to the short-circuiting. Hence, even if static electricity is applied at any of the locations on the electronic component 1, discharge current does not flow between any of the gate electrode 10g, the source electrode 10s, or the drain electrode 10d.

When the substrate of the semiconductor device 10 is a wide gap semiconductor such as GaN, or SiC, the anti-static properties of the semiconductor device 10 tend to be reduced in comparison to the anti-static properties of silicon semiconductor devices. Such a tendency is not altered for the electronic component 1 in which the semiconductor device 10 is sealed using a resin. One factor in the deterioration of the anti-static properties is that parasitic capacitance of wide gap semiconductor devices is smaller than that of silicon semiconductor devices.

Under such conditions, there is a risk that, unless the conductive body 50 is provided, the discharge currents resulting from static electricity will flow between any of the gate electrode 10g, the source electrode 10s and the drain electrode 10d immediately prior to mounting. Specifically, the electronic component may be rendered faulty by static electricity immediately prior to mounting.

To prevent static electricity damage immediately prior to mounting, silicon semiconductor devices have, for example, been provided with a Zener diode to protect the internal parts of the device from static electricity. However, wide gap semiconductor devices cannot be provided with a Zener diode.

A countermeasure of providing a Zener diode external to the electronic component 1 also exists, but such a countermeasures result in increased cost and reduction in performance. Here, "reduction in performance" refers to a substantial increase in parasitic capacitance of the electronic component 1 due to the provision of the external Zener diode. In other words, the significance of using the wide gap semiconductor as the substrate of the semiconductor device 10 is lost.

Thus, in the embodiment, though the semiconductor device 10 is a wide gap semiconductor device, the anti-static properties of the electronic component 1 are improved through the provision of the conductive body 50.

Further, the conductive body 50 can be removed from the electronic component 1 by a simple action of peeling off. Hence, use of the electronic component 1 does not result in extra work on the user side of the electronic component 1. Further, due to the conductive body 50 having a simple construction, cost rises of the electronic component 1 can be kept down.

Also, the conductive bodies 40 connected to the leads 20 are routed from portions of the leads 20 to the upper surface 30$u$ of the resin body 30 along the side surfaces 30$w$ of the resin body 30. The conductive body 50 is provided on the upper surface 30$u$. Here, the upper surface 30$u$ is, for example, a two-dimensional flat surface. Hence, in the first embodiment, a flat two-dimensional surface is reserved as a region for providing the conductive body 50. The provision of this area makes it unlikely that a faulty contact with the conductive body 40 will result from a deformation due to warping or the like of the conductive body 50. Thus, adhesion and protection of the conductive body 50 can be ensured. Further, the conductive body 50 can be easily removed. Also, because the conductive body 50 can be reliably removed, the reliability of the electronic component 1 (semiconductor device 10) after removal of the conductive body 50 is increased.

Note that the means of removing the conductive body 50 is not limited to peeling off.

For example, the conductivity of the conductive body 50 may be deactivated by heating the conductive body 50 to alter the conductivity during reflow processing. Alternatively, the conductive body 50 may be removed by heating to deactivate the adhesive strength of the adhesive during reflow processing.

Further, after mounting, the conductive body 50 may be disconnected by physical (for example, pulling away), chemical (dissolution), thermal (melting, degeneration or optical (decomposition using UV light, laser disconnection) means.

Second Embodiment

Figure 3A:
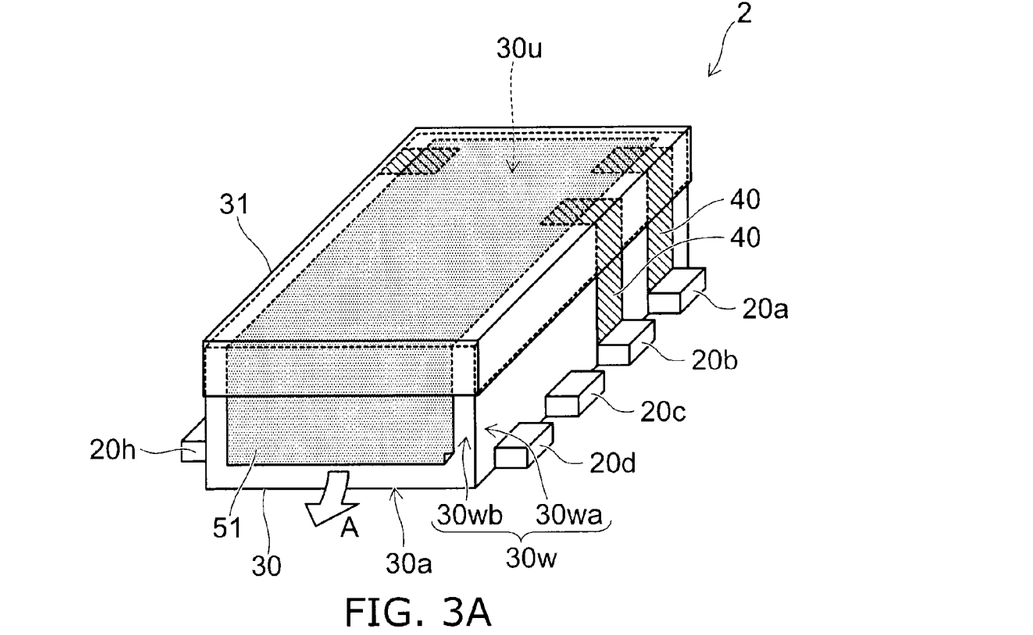
FIG. 3A is a schematic perspective view of an electronic component according to a second embodiment.
Figure 3B:
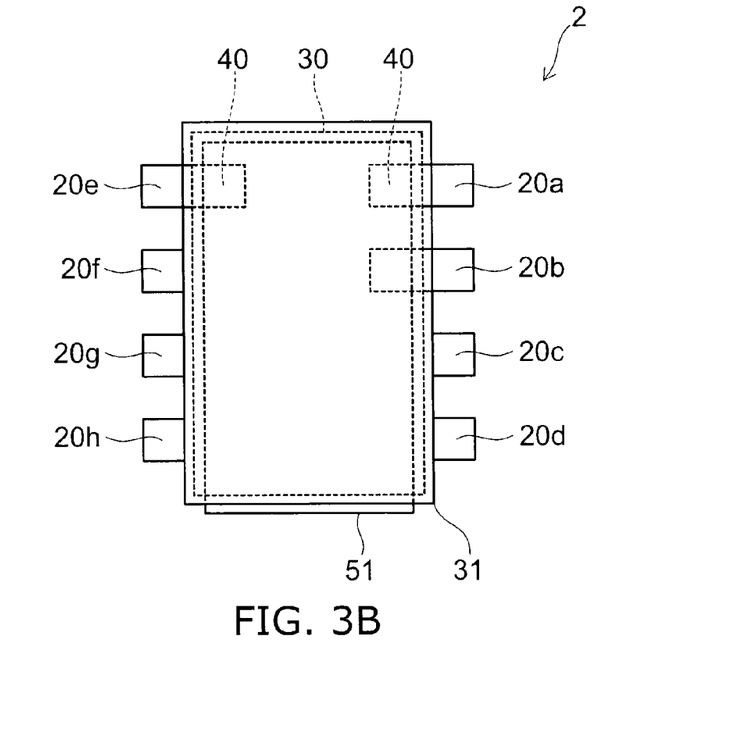
FIG. 3B is a schematic plan view of the electronic component according to the second embodiment.

FIG. 3A is a schematic perspective view of an electronic component according to a second embodiment. FIG. 3B is a schematic plan view of the electronic component according to the second embodiment.

In FIG. 3A and FIG. 3B, the depiction of the semiconductor device 10 is omitted. An electronic component 2 includes the semiconductor device 10 illustrated in FIG. 1A and FIG. 1B. Further, a material of a conductive body 51 provided on the electronic component 2 is the same as the material of the conductive body 50. However, the conductive body 51 is longer in the longitudinal direction than the conductive body 50. The conductive body 51 is provided on the resin body 30 and contacts all the plurality of conductive bodies 40.

The electronic component 2 according to the second embodiment further includes, besides the elements of the electronic component 1, a cap-like resin body 31 (second resin body). The resin body 31 has insulation properties. The resin body 31 covers an upper surface 30$u$ of the resin body 30 and portions on each a side surface 30$wa$ and a side surface 30$wb$ via the conductive body 51. In other words, the structure of resin body sealing the semiconductor device 10 is a two-layer structure including the resin body 30 and the resin body 31. The conductive body 51 is provided between the resin layers of the two-layer structure.

In the electronic component 2, the conductive body 51 can, for example, be pulled out from between the resin body 30 and the resin body 31 in the direction A. For instance, after the electronic component 2 is mounted on a circuit board, the conductive body 51 can be removed from the electronic component 2 by pulling the conductive body 51 out from between the resin body 30 and the resin body 31. After the conductive body 51 has been removed from the electronic component 2, the gate electrode 10$g$, the source electrode 10$s$ and the drain electrode 10$d$ of the semiconductor device 10 are each in a state of not being electrically connected. Note that the form of the electronic component resulting from removal of the conductive body 51 from the electronic component 2 is also included in the second embodiment.

The electronic component 2 includes the conductive body 51. As a result, the electronic component 2 has the same effects as the electronic component 1. The electronic component 2 also has the following effect.

In the electronic component 2, the resin body 31 is provided on the conductive body 40 even when the conductive body 51 is removed from the electronic component 2. Hence, after the conductive body 51 is removed from the electronic component 2, each of the plurality of conductive bodies 40 is covered by the resin body 31.

As the flat surface of the electronic component 2 becomes smaller, the electronic component 2 becomes more susceptible to the effects of static electricity. For example, when the flat surface size of the electronic component 2 is 5 mm square or less, a distance between the conductive body 40 connected to the lead 20$a$ and the conductive body 40 connected of the lead 20$e$ may be of the order of a few mm (3 mm, for instance).

Under such conditions, the plurality of conductive bodies 40 will be more susceptible to the effects of static electricity if the plurality of conductive bodies 40 are not covered by the resin body 31 after mounting. Specifically, even after mounting, there is a risk that discharge currents resulting will flow between any of the gate electrode 10$g$, the source electrode 10$s$ and the drain electrode 10$d$. As a result, electric components provided on the circuit board can be rendered faulty by the static electricity.

As a countermeasure, in the electronic component 2, each of the plurality of conductive bodies 40 is covered by the resin body 31 even after the conductive body 51 is removed. Hence, after the mounting, static electricity will not be applied to any of the plurality of conductive bodies 40. Thus, with the electronic component 2, anti-static properties are improved before and after mounting.

Third Embodiment

Figure 4A:
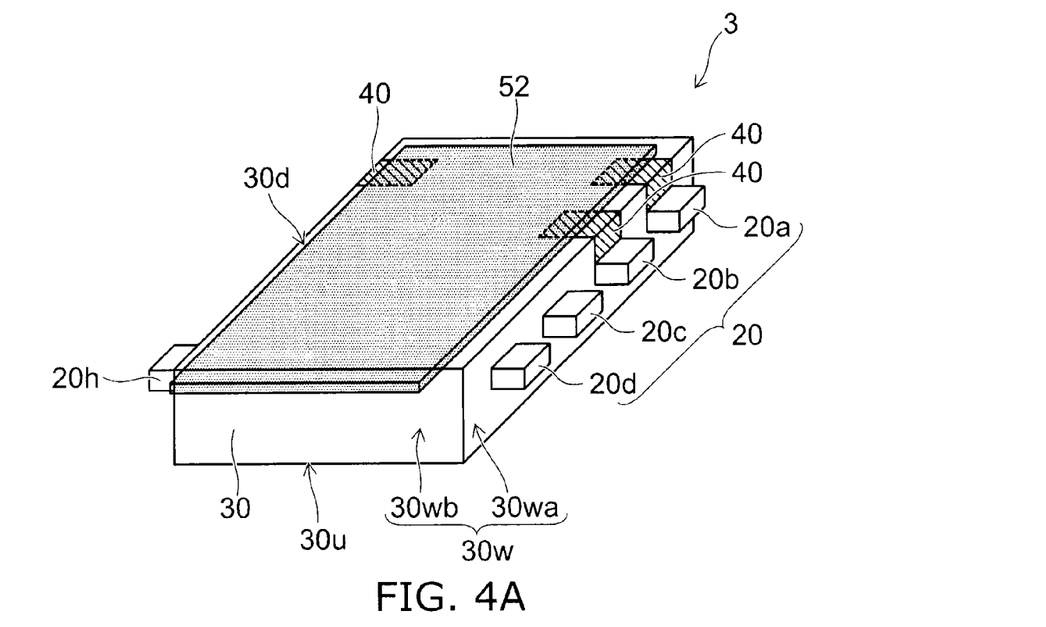
FIG. 4A is a schematic perspective view of an electronic component according to a third embodiment.
Figure 4B:
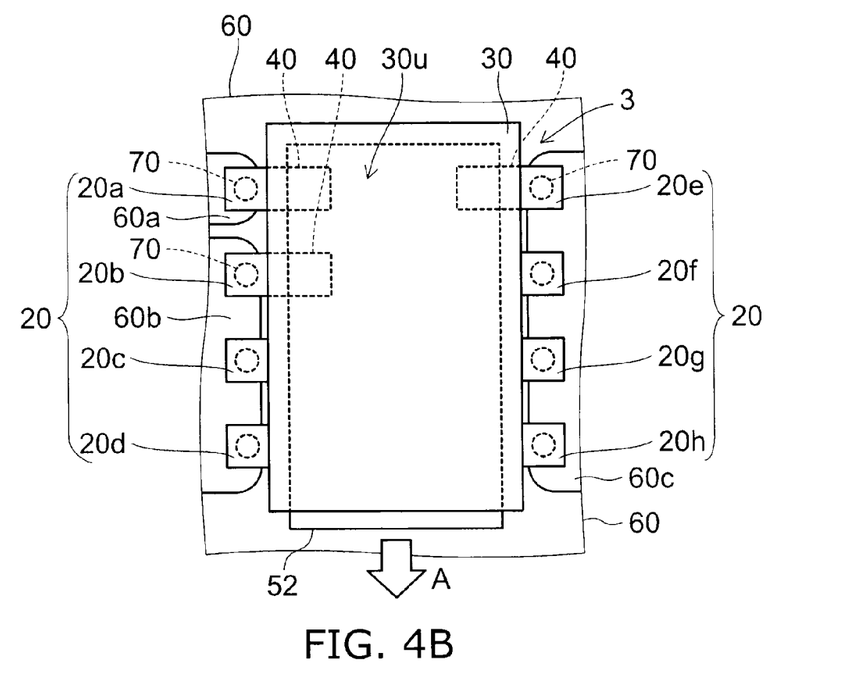
FIG. 4B is a schematic plan view of the electronic component according to the third embodiment.

FIG. 4A is a schematic perspective view of an electronic component according to a third embodiment. FIG. 4B is a schematic plan view of the electronic component according to the third embodiment.

FIG. 4B illustrates the circuit board 60 immediately after mounting, and an electronic component 3.

In FIG. 4A and FIG. 4B, the depiction of the semiconductor device 10 is omitted. The electronic component 3 includes the semiconductor device 10 illustrated in FIG. 1A and FIG. 1B. Further, a material of a conductive body 52 provided on the electronic component 3 is the same as the material of the conductive body 50. The conductive body 52 is longer in the longitudinal direction than the conductive body 50.

In the electronic component 3 according to the third embodiment, the conductive body 52 is provided on a lower surface 30d of the resin body 30. The conductive body 52 contacts all of the plurality of conductive bodies 40.

Specifically, the resin body 30 includes the upper surface 30u, the lower surface 30d and the side surfaces 30w. A part of each of the plurality of leads 20 protrudes from one of the two side surfaces 30w of the resin body 30. Each of the plurality of conductive bodies 40 extends from the corresponding one of the plurality of leads 20a, 20b and 20e to the lower surface 30d along the side surface 30w. The conductive body 52 contacts the plurality of conductive bodies 40 that extend to the lower surface 30d.

In the electronic component 3, the conductive body 52 can be removed from the resin body 30. In the case of the electronic component 3, after the electronic component 3 is mounted on the circuit board 60, the conductive body 52 can, for example, be pulled out from between the resin body 30 and the circuit board 60 in the direction marked by arrow A. After the conductive body 52 has been removed from the electronic component 3, the gate electrode 10g, the source electrode 10s and the drain electrode 10d of the semiconductor device 10 are each in a state of not being electrically connected. Note that the form of the electronic component resulting from removal of the conductive body 52 from the electronic component 3 is also included in the third embodiment.

The electronic component 3 includes the conductive body 52. As a result, the electronic component 3 has the same effects as the electronic component 1. The electronic component 3 also has the following effect.

In the electronic component 3, the resin body 30 is provided on the conductive body 40 even when the conductive body 52 is removed from the electronic component 3. Hence, after the conductive body 52 is removed from the electronic component 3, each of the plurality of conductive bodies 40 is covered by the resin body 30. In other words, each the plurality of conductive bodies 40 is covered by the resin body 30 itself.

Thus, in the electronic component 3, each of the plurality of conductive bodies 40 is covered by the resin body 30 even after the conductive body 52 is removed. Hence, after the mounting, static electricity will not be applied to any of the plurality of conductive bodies 40. Thus, with the electronic component 3, anti-static properties are improved before and after mounting.

Fourth Embodiment

Figure 5A:
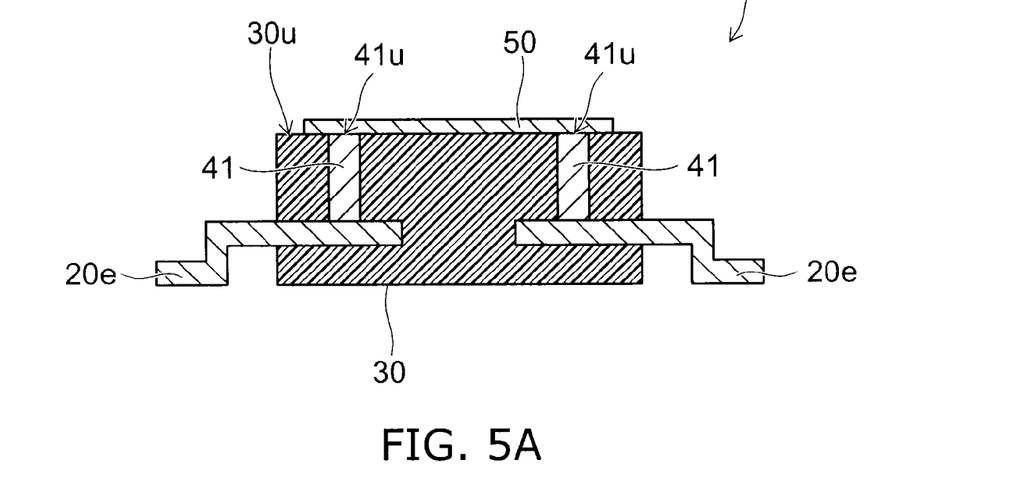
FIG. 5A is a schematic cross-sectional view of an electronic component according to a fourth embodiment.
Figure 5B:
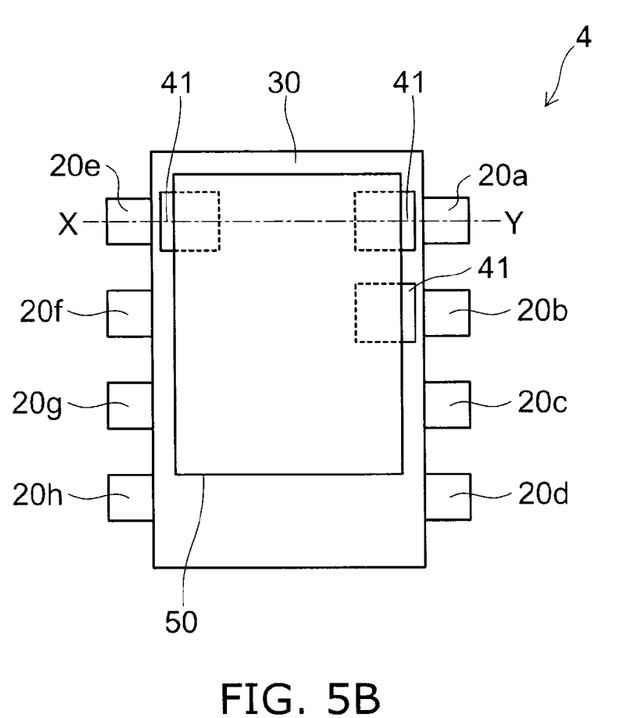
FIG. 5B is a schematic plan view of the electronic component according to the fourth embodiment.

FIG. 5A is a schematic cross-sectional view of an electronic component according to a fourth embodiment. FIG. 5B is a schematic plan view of the electronic component according to the fourth embodiment.

FIG. 5A illustrates a cross-sectional view through X-Y in FIG. 5B.

In FIG. 5A and FIG. 5B, the depiction of the semiconductor device 10 is omitted. An electronic component 4 includes the semiconductor device 10 illustrated in FIG. 1A and FIG. 1B.

Besides the above-described semiconductor device 10, the electronic component 4 includes the plurality of leads 20, a resin body 30, a plurality of vias 41 (conductive bodies), and a conductive body 50.

The plurality of vias 41 is connected to the plurality of leads 20a, 20b and 20e, respectively. Each of the plurality of vias 41 has a portion sealed by the resin body 30. At the upper surface 30u of the resin body 30, upper ends 41u of the each of the plurality of vias 41 is exposed. The conductive body 50 is provided on the resin body 30. The conductive body 50 contacts all of the plurality of vias 41.

In the electronic component 4, the lead 20a electrically connected to the gate electrode 10g, the lead 20b electrically connected to the source electrode 10s and the lead 20e electrically connected to the drain electrode 10d are each connected to the conductive body 50 via a corresponding via 41. Hence, the electronic component 4 has the same effects as the electronic component 1.

Fifth Embodiment

Figure 6:
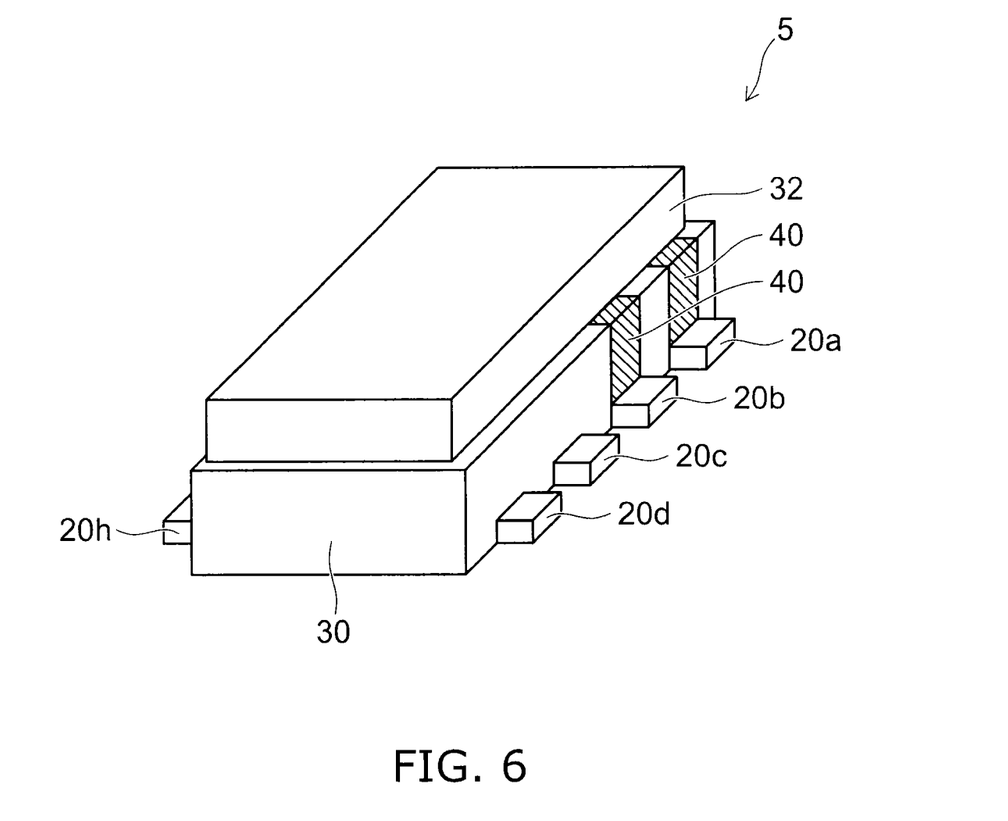
FIG. 6 is a schematic perspective view of an electronic component according to a fifth embodiment.

FIG. 6 is a schematic perspective view of an electronic component according to a fifth embodiment.

In the second embodiment, the conductive body 40 is protected by the resin body 31 after the conductive body 51 has been removed from the electronic component 2. However, the member electrically protecting the conductive body 40 is not limited to the resin body 31.

In FIG. 6, a depiction of the semiconductor device 10 is omitted. An electronic component 5 includes the semiconductor device 10 illustrated in FIG. 1A and FIG. 1B. Besides the above-described semiconductor device 10, the electronic component 5 includes the plurality of leads 20, the resin body 30, the conductive bodies 40 and an insulating body 32.

The conductive body 32 is provided on the resin body 30. The conductive body 32 contacts all of the plurality of conductive bodies 40. The insulating body 32 is formed by a coating method or the like after the above-described conductive body 50 is peeled from the electronic component 5.

In the electronic component 5, each of the plurality of conductive bodies 40 is covered by the insulating body 32 even after the conductive body 50 is removed. Hence, after the mounting, static electricity will not be applied to any of the plurality of conductive bodies 40. Thus, with the electronic component 5, anti-static properties are improved before and after mounting.

Sixth Embodiment

Figure 7A:
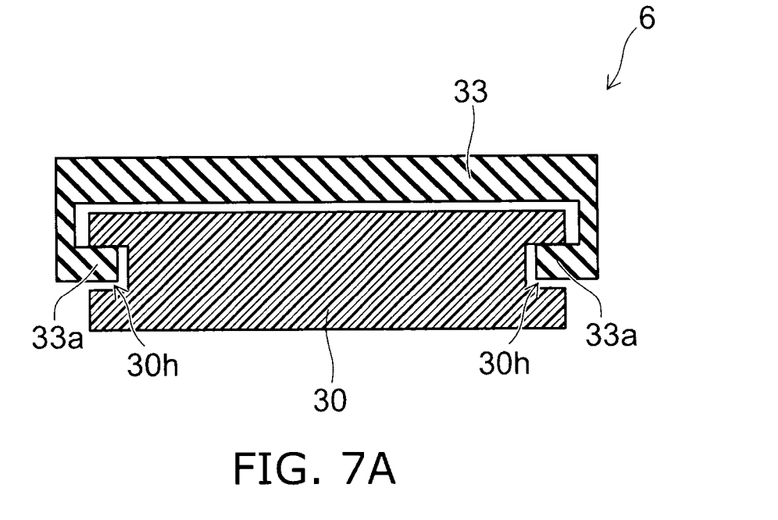
FIG. 7A is a schematic perspective view of an electronic component according to the sixth embodiment.
Figure 7B:
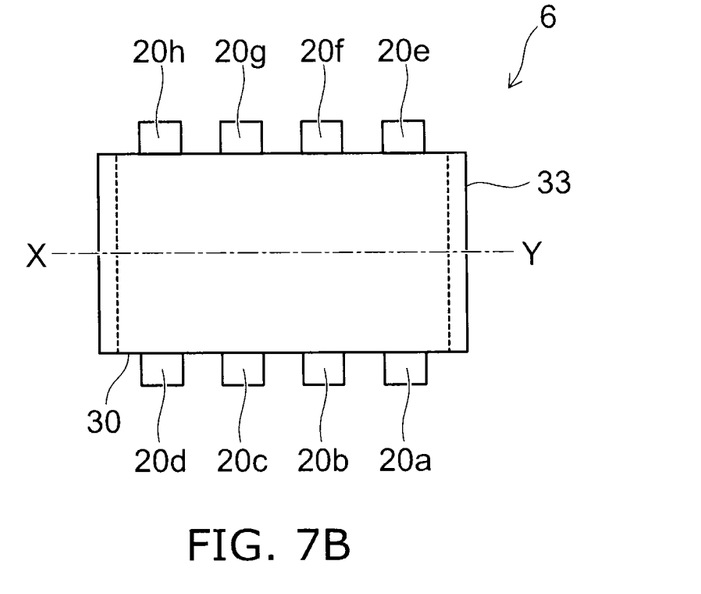
FIG. 7B is a schematic plan view of the electronic component according to the sixth embodiment.

FIG. 7A is a schematic perspective view of an electronic component according to the sixth embodiment. FIG. 7B is a schematic plan view of the electronic component according to the sixth embodiment.

FIG. 7A illustrates a cross-sectional view through X-Y in FIG. 7B.

In FIG. 7A and FIG. 7B, the depiction of the semiconductor device 10 is omitted. An electronic component 6 includes the semiconductor device 10 illustrated in FIG. 1A and FIG. 1B.

Besides the above-described semiconductor device 10, the electronic component 6 includes the plurality of leads 20, the resin body 30, the conductive bodies 40, and an insulating body 33.

The insulating body 33 is provided on the resin body 30. The insulating body 33 contacts all of the plurality of conductive bodies 40. After the above-described conductive body 50 is peeled from the electronic component 6, a portion of the insulating body 33 is attached to the resin body 30 as result of mating with the resin body 30. For example, a protruding portion 33a on the insulating body 33 is mated to a recessed portion 30h provided on a side surface of the resin body 30.

In the electronic component 6, each of the plurality of conductive bodies 40 is protected by the insulating body 33 even after the conductive body 50 is removed. Hence, after the mounting, static electricity will not be applied to any of the plurality of conductive bodies 40. Thus, with the electronic component 6, anti-static properties are improved before and after mounting.

Seventh Embodiment

Figure 8:
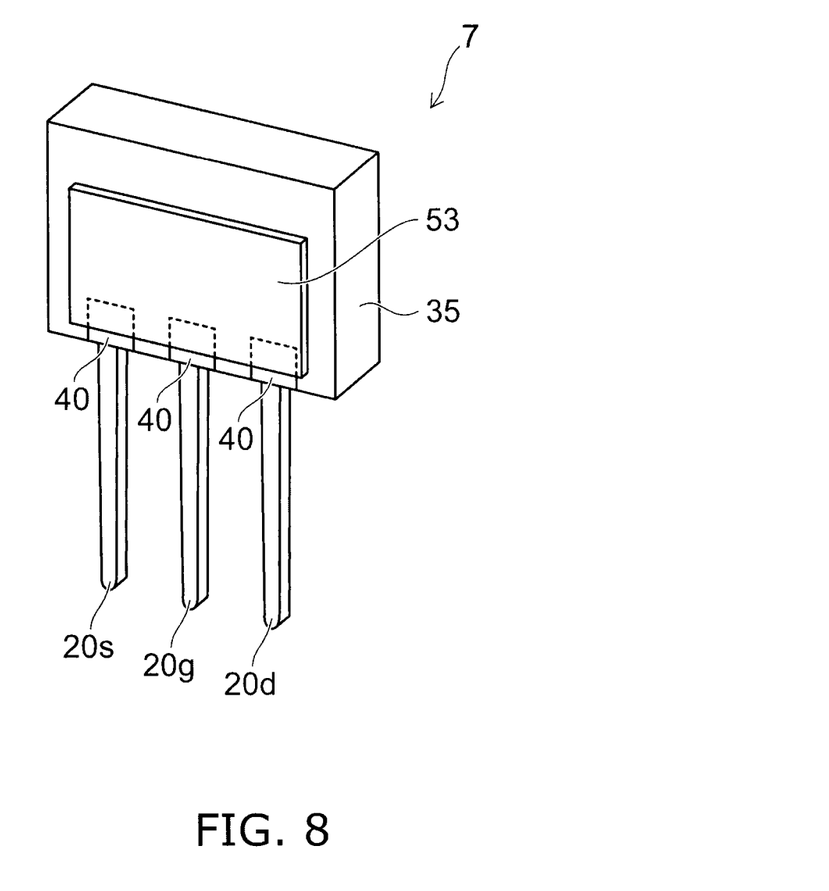
FIG. 8 is a schematic perspective view of an electronic component according to a seventh embodiment.

FIG. 8 is a schematic perspective view of an electronic component according to a seventh embodiment.

The electronic component according to the embodiment is not limited to being the above-described surface-mounted package, and may be an insertion type package.

An electronic component 7 illustrated in FIG. 8 is a semiconductor device such a metal oxide semiconductor field effect transistor sealed with a resin body 35. A lead 20g electrically connected to a gate electrode of the semiconductor device, a lead 20s electrically connected to the source electrode and a lead 20d electrically connected to the drain electrode are connected to a conductive body 53 via the conductive bodies 40. A material of the conductive body 53 is the same as the material of the conductive body 50. The electronic component of such a form is also included in the embodiment.

Further, the above-described semiconductor device 10 is not limited to being a MOSFET or diode, but may be a semiconductor memory device, or magnetic memory device. Thus, the electronic component according to the embodiment includes such devices.

Hereinabove, exemplary embodiments of the invention are described with reference to specific examples. However, the embodiments of the invention are not limited to these specific examples. That is, these specific examples can be added appropriately with the design variation by those skilled in the art and such specific examples are included in the scope of embodiments to the extent that the features of the embodiments are included. The components included in the previously described specific examples and its arrangement, material, condition, shape, size or the like are not limited to the illustration, and can be appropriately modified.

The components included in the previously described embodiments can be combined each other as long as technically feasible, and such combinations are also encompassed within the scope of the invention as long as they fall within the spirit of the invention. Various other variations and modifications can be conceived by those skilled in the art within the spirit of the embodiments, and it is understood that such variations and modifications are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An electronic component comprising:
   a device having a plurality of electrodes;
   a plurality of leads, wherein each lead of the plurality of leads is electrically connected to an electrode of the plurality of electrodes;
   a first resin body sealing the device and a portion of each lead of the plurality of leads; and
   a plurality of first conductive bodies connected to the plurality of leads and contactable with a second conductive body,
   a total of a resistance of the plurality of the first conductive bodies and a contact resistance of the plurality of the first conductive bodies and the second conductive body being 150Ω or less.

2. The electronic component according to claim 1, further comprising the second conductive body, the second conductive body contacts the plurality of first conductive bodies, and the second conductive body is provided on a surface of the first resin body.

3. The electronic component according to claim 2, wherein the first resin body includes an upper surface, a lower surface and a side surface,
   a part of each of the plurality of leads protrudes from the side surface of the first resin body,
   each of the plurality of first conductive bodies extends from the plurality of leads to the upper surface along the side surface, and
   the second conductive body is provided on the upper surface and on the plurality of first conductive bodies extending to the upper surface.

4. The electronic component according to claim 2, further comprising a second resin body, and the second resin body covers the upper surface and a portion of the side surface of the first resin body via the second conductive body.

5. The electronic component according to claim 2, wherein the first resin body includes an upper surface, a lower surface and a side surface,
   a part of each of the plurality of leads protrudes from the side surface of the first resin body,
   each of the plurality of first conductive bodies extends from the plurality of leads via the side surface, and
   the second conductive body is provided on the lower surface and on the plurality of first conductive bodies extending to the lower surface.

6. The electronic component according to claim 2 wherein the second conductive body is one of a conductive seal, a conductive gel, and a conductive deposition film.

7. The electronic component according to claim 6, wherein the conductive seal includes a conductive material and an adhesive material.

8. The electronic component according to claim 7, wherein an adhesive strength of the adhesive material is reduced by heating.

9. The electronic component according to claim 2, wherein the second conductive body is transformed by heating.

10. The electronic component according to claim 1, wherein the device is a field effect transistor, and the plurality of electrodes includes a gate electrode, a source electrode and a drain electrode of the field effect transistor.

11. The electronic component according to claim 10, wherein the field effect transistor includes a gallium nitride layer or a silicon nitride layer.

12. The electronic component according to claim 1, a portion of each of the plurality of first conductive bodies is sealed by the first resin body.

13. The electronic component according to claim 12, further comprising the second conductive body, the second conductive body contacts each of the plurality of first conductive bodies, and the second conductive body is provided on a surface of the first resin body.

14. The electronic component according to claim 13, wherein the first resin body includes an upper surface, a lower surface and a side surface, each of the plurality of first conductive bodies extends from the plurality of leads to the upper surface, and the second conductive body is provided on the upper surface and on the plurality of leads extending to the upper surface.

15. The electronic component according to claim 13, further comprising a second resin body, and the second resin body covers the upper surface and a portion of the side surface of the first resin body via the second conductive body.

16. The electronic component according to claim 13, wherein the second conductive body is one of a conductive seal, a conductive gel, and a conductive deposition film.

17. The electronic component according to claim 16, wherein the conductive seal includes a conductive material and an adhesive material.

18. The electronic component according to claim 17, wherein an adhesive strength of the adhesive material is reduced by heating.

* * * * *